(12) United States Patent
Kim et al.

(10) Patent No.: US 9,136,574 B2
(45) Date of Patent: Sep. 15, 2015

(54) COMPACT 3-D COPLANAR TRANSMISSION LINES

(71) Applicant: QUALCOMM MEMS Technologies, Inc., San Diego, CA (US)

(72) Inventors: Daeik Daniel Kim, San Diego, CA (US); David Francis Berdy, West Lafayette, IN (US); Jonghae Kim, San Diego, CA (US); Chengjie Zuo, Santee, CA (US); Changhan Hobie Yun, San Diego, CA (US); Mario Francisco Velez, San Diego, CA (US); Je-Hsiung Jeffrey Lan, San Diego, CA (US); Robert Paul Mikulka, Oceanside, CA (US)

(73) Assignee: QUALCOMM Incorporated, San Diego, CA (US)

( * ) Notice: Subject to any disclaimer, the term of this patent is extended or adjusted under 35 U.S.C. 154(b) by 214 days.

(21) Appl. No.: 13/914,474

(22) Filed: Jun. 10, 2013

(65) Prior Publication Data

US 2014/0361854 A1 Dec. 11, 2014

(51) Int. Cl.
| H01P 3/08 | (2006.01) |
| H01P 3/02 | (2006.01) |
| H05K 1/02 | (2006.01) |
| H01P 3/00 | (2006.01) |

(52) U.S. Cl.
CPC ................ *H01P 3/026* (2013.01); *H01P 3/003* (2013.01); *H05K 1/0237* (2013.01)

(58) Field of Classification Search
CPC .............................. H01P 3/026; H05K 1/0237
USPC .................................. 333/238, 33–34, 26, 246
See application file for complete search history.

(56) References Cited

U.S. PATENT DOCUMENTS

| 4,554,567 | A | * | 11/1985 | Jillie et al. ........................ 257/36 |
| 6,215,377 | B1 | * | 4/2001 | Douriet .......................... 333/247 |
| 6,329,702 | B1 | * | 12/2001 | Gresham et al. ............... 257/623 |
| 7,336,139 | B2 | | 2/2008 | Blair et al. |
| 7,400,222 | B2 | * | 7/2008 | Kwon et al. ................... 333/243 |
| 2005/0098348 | A1 | | 5/2005 | Okumichi et al. |
| 2007/0045857 | A1 | * | 3/2007 | Wark et al. ..................... 257/773 |
| 2007/0120250 | A1 | * | 5/2007 | Fairchild et al. ............... 257/712 |
| 2010/0182105 | A1 | | 7/2010 | Hein et al. |

OTHER PUBLICATIONS

International Search Report and Written Opinion—PCT/US2014/041574—ISA/EPO—Sep. 19, 2014.

(Continued)

*Primary Examiner* — Dinh Le
(74) *Attorney, Agent, or Firm* — Muncy, Geissler, Olds & Lowe, P.C.

(57) ABSTRACT

This disclosure provides systems, methods and apparatus for a compact 3-D coplanar transmission line (CTL). In one aspect, the CTL has a proximal end and a distal end separated, in a first plane, by a distance D, the first plane being parallel to a layout area of a substrate. The plane is defined by mutually orthogonal axes x and z The CTL provides a conductive path having pathlength L. D is substantially aligned along axis z, L is at least 1.5×D, and the CPW is configured such that at least one third of the pathlength L is disposed along one or more directions having a substantial component orthogonal to the first plane. Less than one third of the pathlength L is disposed in a direction having a substantial component parallel to axis x.

20 Claims, 10 Drawing Sheets

(56) References Cited

OTHER PUBLICATIONS

Lamy P.R., et al., "RF Characterization and Analytical Modelling of Through Silicon Vias and Coplanar Waveguides for 3D Integration", IEEE Transactions on Advanced Packaging, IEEE Service Center, Piscataway, NJ, USA, vol. 33, No. 4, Nov. 1, 2010, pp. 1072-1079, XP011341659, ISSN: 1521-3323, DOI: 10.1109/TADVP.2010.2046166.

Mahmood M.R., et al., "Modelling of 3D Multi layer Coplanar Waveguide Structure with Incorporated Wideband Vertical Interconnection", European Microwave Conference, 2000. 30th. IEEE. Piscataway, NJ, USA, Oct. 1, 2000, pp. 1-4, XP031067464.

Cho Y.S. et al., "Novel Broadband Through Silicon Via Interconnect for Three Dimensional CPW Transition," Proceedings of the 40th European Microwave Conference, Sep. 28-30, 2010, pp. 113-116.

Huang C.U. et al., "Compact 3D-MEMS-meander monopole antenna," Electronics Letters, Oct. 13, 2005, pp. 1-2, vol. 41 No. 21.

Sun et al., "A Novel meandered coplanar waveguide for RF microelectromechanical systems," Journal of Micromechanics and Microengineering, 2007, pp. 1628-1631.

* cited by examiner

Detail (a)

View A-A

Detail (b)

COMPACT 3-D COPLANAR TRANSMISSION LINES

TECHNICAL FIELD

This disclosure relates to coplanar transmission lines, including coplanar waveguides and coplanar striplines, and particularly to a compact three-dimensional (3-D) arrangement of such transmission lines.

DESCRIPTION OF THE RELATED TECHNOLOGY

Electromechanical systems (EMS) include devices having electrical and mechanical elements, actuators, transducers, sensors, optical components such as mirrors and optical films, and electronics. EMS devices or elements can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

Microwave circuits may utilize conductive strips configured as coplanar transmission lines (CTL), including, for example, coplanar waveguides (CPW) and coplanar striplines (CPS), for various applications. For example, CTL may be used for impedance matching and filtering, and as components of power amplifiers, matching networks, transmission line filters, resonators and phase shifters. The layout area required for at least some applications of CTLs can be significant; for example, a CPW providing one quarter wavelength electrical line length for a 10 GHz signal may be about 4 mm or longer in length and have a width of about 1 mm. As a result, techniques that enable a reduction in layout area without sacrificing electrical performance of the CTL are desirable.

SUMMARY

The systems, methods and devices of this disclosure each have several innovative aspects, no single one of which is solely responsible for the desirable attributes disclosed herein.

One innovative aspect of the subject matter described in this disclosure can be implemented in an apparatus including a coplanar transmission line (CTL). The CTL includes a number of communicatively coupled segments, at least a first segment being parallel to a layout area of a substrate, at least a second segment being disposed so as to pass through at least a portion of the substrate at an angle to the layout area having a substantial component orthogonal to the layout area, and at least a third segment being parallel to and underneath the layout area, at a substantial depth relative to the layout area.

In some implementations, the apparatus may include at least a fourth segment and a fifth segment, the fourth segment being disposed so as to pass through at least a portion of the substrate at an angle to the layout area having a substantial component orthogonal to the layout area, the fifth segment being parallel to the substrate and within the layout area. The fifth segment may be substantially co-planar with the first segment. In some implementations the substrate may be glass.

Another innovative aspect of the subject matter described in this disclosure can be implemented in a CTL having a proximal end and a distal end separated, in a first plane, by a distance 'D', the first plane being parallel to a layout area of a substrate, and being defined by an axis 'x' and an axis 'z' orthogonal thereto, the CTL providing a signal transmission path having pathlength 'L'. D is substantially aligned along axis z and L is at least 1.5×D. The CTL is configured such that at least one third of the pathlength L is disposed along one or more directions having a substantial component orthogonal to the first plane, and less than one third of the pathlength L is disposed in a direction having a substantial component parallel to axis x.

In some implementations, the CTL is disposed such that the signal transmission path substantially follows a square wave pattern, a curvilinear wave pattern or a sawtooth pattern.

Another innovative aspect of the subject matter described in this disclosure can be implemented in an apparatus including a signal transmission path. The signal transmission path includes a plurality of communicatively coupled segments, at least a first segment being parallel to a layout area of a substrate, and at least a second segment being disposed at an angle to the layout area having a substantial component orthogonal to the layout area, the signal transmission path being disposed between two conductive ground lines, at least one of the conductive ground lines including a first conductive planar strip and a second, substantially parallel, conductive planar strip, the first and second conductive planar strips being connected by a plurality of metal shielding vias and the first conductive strip being substantially coplanar with the first segment.

Details of one or more implementations of the subject matter described in this disclosure are set forth in the accompanying drawings and the description below. Although the examples provided in this disclosure are primarily described in terms of EMS and MEMS-based displays the concepts provided herein may apply to radio frequency, microwave and millimeter wave applications, as well as other types of displays such as liquid crystal displays (LCDs), organic light-emitting diode (OLED) displays, and field emission displays. Other features, aspects, and advantages will become apparent from the description, the drawings and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1:
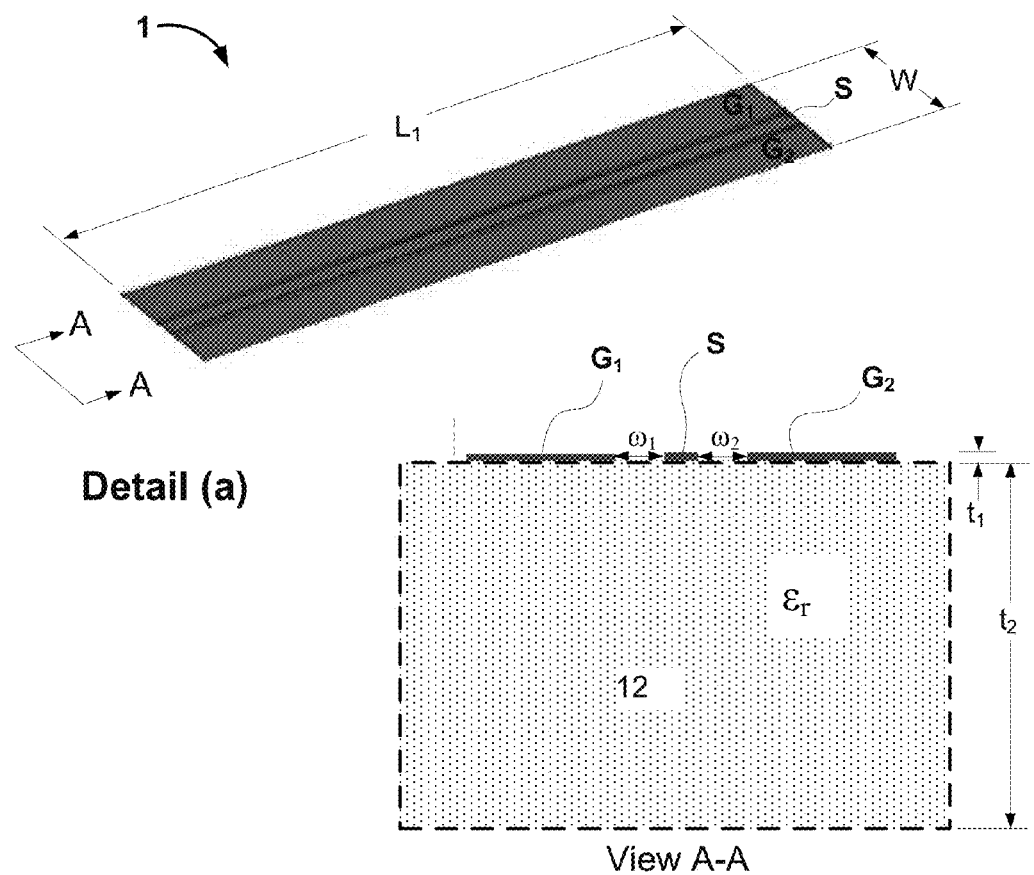
FIG. 1 illustrates examples of a coplanar waveguide.
Figure 1:
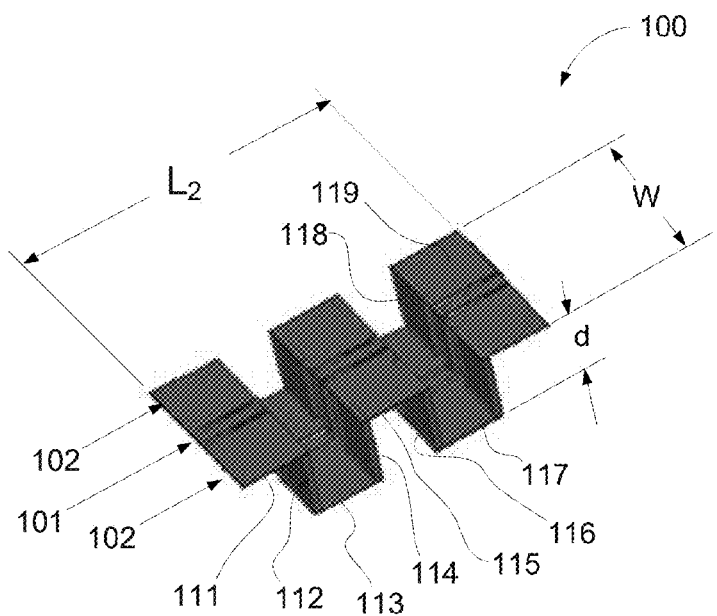

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

The implementations described herein relate to three-dimensional (3-D) arrangements of coplanar transmission lines (CTL). Advantageously, the arrangements enable a significant reduction in packaging size. An arrangement may be configured as a coplanar waveguide (CPW) or a coplanar stripline (CPS) having a particular electrical line length ("pathlength") that is related to a characteristic wavelength of a signal to be carried by a signal transmission path. For example, a CPW providing one quarter wavelength electrical line length for a 10 GHz signal may have a pathlength of about 4 mm or longer. Thus, a CPW, when disposed in a single plane within a planar layout area of a substrate, may require dedication of a significant portion of the substrate layout area.

As a result of the techniques disclosed herein, a significant reduction in required substrate layout area may be achieved without sacrificing electrical performance of the CTL. In particular, for a CTL having a pathlength L, a distance D between a proximal end and a distal end of the CPW, measured in a first plane that is parallel to the substrate layout area, may be less than L/1.5. The CPW may be arranged such that at least one third of the pathlength is disposed along one or more directions having a substantial component orthogonal to the substrate layout area. Where the first plane is defined by mutually orthogonal x and z axes, and distance D is aligned along axis z, the CPW may be arranged such that less than one third of the pathlength 'L' is disposed in a direction having a substantial component parallel to axis x.

In some implementations, the CTL may be arranged as a series of communicatively coupled segments. A first segment may be disposed parallel to the substrate layout area. A second segment may be disposed so as to pass through at least a portion of the substrate at an angle to the layout area having a substantial component orthogonal to the substrate layout area. A third segment may be disposed in the substrate, parallel to and underneath the layout area, at a substantial depth relative to the layout area. The second segment may include at least one conductive path configured as a via.

In some implementations, the segments may be configured as mutually perpendicular, straight segments. In some other implementations, a segment may include a curvilinear portion and/or may be disposed non-orthogonally with respect to an adjacent segment. The substrate may be photoglass, or another type of glass, or any electrically isolating or dielectric material. In some implementations, the substrate may provide a layout area, within which the CTL and other circuit elements with which the CTL is associated may be disposed. Conductive strips configured as vias may be through-glass vias, and/or may include metallic conductive material, a thickness of which may be adjusted to provide a desired impedance.

In some implementations, improved shielding of a transmission path may be provided. For example, a signal transmission path may be disposed proximate to and parallel to conductive ground lines. At least one of the conductive ground lines may include a first conductive planar strip substantially coplanar with at least one segment of the conductive signal line. A second conductive planar strip may be disposed substantially parallel to the first conductive planar strip at a substantial depth relative to the layout area. The first and second conductive planar strips may be connected by a plurality of metal shielding vias that are configured to provide improved electrical shielding to the signal transmission path. Where the signal transmission path is configured to include a segment disposed so as to pass through at least a portion of the substrate at an angle to the layout area having a substantial component orthogonal to the substrate layout area, one or more metal shielding vias may be disposed proximate to the segment.

Particular implementations of the subject matter described in this disclosure can be implemented to realize one or more of the following potential advantages. A significant reduction in substrate layout area required to accommodate a CTL of a given pathlength is achieved without sacrificing electrical performance. In some implementations, improved electrical performance may be achieved by selectively controlling impedance of one or more of the through glass vias. For example, thickness of conductive layers within a through glass via may be increased or decreased as desired to obtain a desired impedance. In some implementations, a cross sectional shape of the through glass via, and a thickness of conductive layers may be selected to provide improved impedance control and/or a reduction in resistance and consequent signal loss. In some implementations, improved isolation may be provided by metal shielding vias.

One aspect of this disclosure relates to a 3-D arrangement of one or more conductive paths ("conductive signal lines") configured as a CTL. The CTL may be configured, for example, as a CPW or a CPS.

A better understanding of this disclosure may result by first comparing a conventional CPW to a CPW configured in accordance with the teachings in this disclosure. FIG. 1 illustrates examples of a coplanar waveguide. A conventional CPW is illustrated in Detail (a) of FIG. 1, whereas a CPW configured in accordance with the teachings of this disclosure is illustrated in Detail (b) of FIG. 1. As illustrated in Detail (a), a CPW 1 includes parallel, coplanar conductive strips, specifically a conductive strip (signal transmission path) S disposed between two conductive ground strips G1 and G2. A respective gap ω1 and ω2 provides electrical isolation between signal strip S and, respectively, ground strips G1 and G2. As illustrated in view A-A, CPW 1 may be disposed on a surface of a substrate 12. The substrate 12 may be a nonconducting material or may be a dielectric. The substrate 12 may have a dielectric constant $\in_r$. The conductive strips S, G1 and G2 may be thin layers of conductive material, having a thickness $t_1$ typically less than 20 micrometers (μm or microns) disposed on a substrate having a thickness $t_2$ of, typically, up to 1 mm.

The pathlength of the CPW 1 will often be related to a characteristic wavelength of a signal to be carried by the CPW 1. For example, where the CPW 1 is required to provide a one quarter wavelength electrical line length for a 10 GHz signal, a pathlength of about 4 mm or longer will be required. As a result, $L_1$ will be approximately 4 mm, and a layout area in square millimeters required by CPW 1 will be approximately 4×W.

Detail (b) illustrates an example CPW according to an implementation of this disclosure. In the illustrated implementation, a CPW 100 includes parallel, coplanar conductive paths. A signal transmission path 101 may be disposed between two conductive ground strips 102. The CPW 100 may be configured as a plurality of communicatively coupled segments. In the illustrated implementation, for example, nine segments, segment 111, 112, 113, 114, 115, 116, 117, 118 and 119 are provided. A first segment 111 may be disposed parallel to a layout area of a substrate (not illustrated). A second segment 112 may be disposed so as to pass through at least a portion of the substrate (not illustrated) at an angle to the layout area having a substantial component orthogonal to the layout area. A third segment 113 may be disposed parallel to and underneath the layout area, at a substantial depth d relative to the layout area. A fourth segment 114 may be disposed so as to pass through at least a portion of the substrate (not illustrated) at an angle to the layout area having a substantial component orthogonal to the layout area. A fifth segment 115 may be disposed parallel to a layout area of a substrate (not illustrated).

A sixth segment 116 may be disposed so as to pass through at least a portion of the substrate (not illustrated) at an angle to the layout area having a substantial component orthogonal to the layout area. A seventh segment 117 may be disposed parallel to and underneath the layout area. An eighth segment 118 may be disposed so as to pass through at least a portion of the substrate (not illustrated) at an angle to the layout area having a substantial component orthogonal to the layout area. A ninth segment 115 may be disposed parallel to a layout area of a substrate (not illustrated).

Length $L_2$ relates to a separation distance between a proximal end of the CPW 100 and a distal end of the CPW 100 measured in a plane parallel to a layout area of a substrate. It will be appreciated that, for the illustrated implementation, where each of the nine segments have approximately equal length, the length of each segment is approximately $L_2/5$, and the pathlength of CPW 100 is $9 \times L_2/5$. Accordingly, where CPW 100 is required to provide a pathlength of $L_1$, length $L_2$ will be approximately $5 \times L_1/9$. Thus, for a given pathlength, the CPW 100 requires approximately 45% less layout area than the CPW 1. One having ordinary skill in the art will readily appreciate that the reduction in required layout areas may be varied by changing the number of segments in the CPW.

Figure 2:
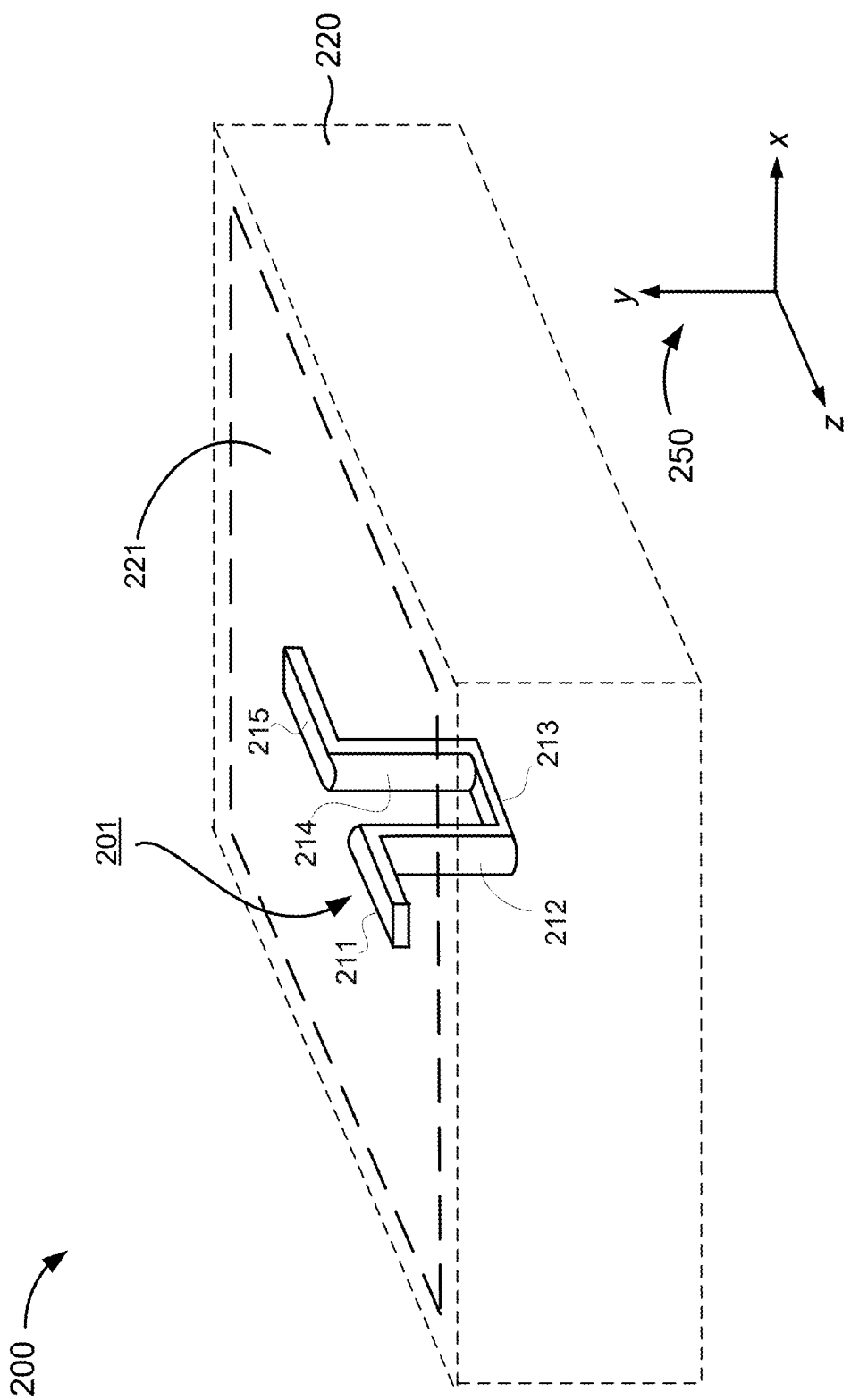
FIG. 2 illustrates an isometric projection of an example implementation of a compact 3-D coplanar transmission line (CTL) arrangement.

FIG. 2 illustrates an isometric projection of an example implementation of a compact 3-D CTL arrangement. An arrangement 200 includes a substrate 220 and a signal transmission path 201. The signal transmission path 201 may be part of a CPW or a CPS, for example, but, for clarity of illustration, conductive strips that would ordinarily be disposed parallel to and proximate to the signal transmission path 201 are omitted from FIG. 2. For convenience of description, a three axis coordinate system 250 is defined such that an x-z plane is defined to be parallel to a substantially planar layout area 221 of the substrate 220. A view taken along the y-axis may hereinafter be referred to as a plan view. A view taken along the x-axis may hereinafter be referred to as a side elevation view. A view taken along the z-axis may hereinafter be referred to as a front elevation view.

A thickness of the substrate 220 along axis y may be between about 30 microns and about 1 millimeter, such as about 300 microns. An area of the layout area 221 may be on the order of several square millimeters and, desirably, should be as small as possible. In addition to at least portions of the signal transmission path 201, a number of discrete or integrated circuit components may be disposed within the layout area 221. For example, the signal transmission path 201 may be a component of a power amplifier, a matching network, a transmission line filter, a resonator or phase shifters, some other associated components of which may disposed within the layout area 221.

The substrate 220 may be a dielectric or electrically isolating material, as mentioned throughout this disclosure. In some implementations, the substrate 220 is a glass composition. The glass composition may include any suitable type of glass known in the art, including but not limited to photoglass, borosilicate glass, soda lime glass, quartz, Pyrex, or other glass material. In some implementations, the glass substrate may include a photoimageable glass. One example of photoimageable glass is APEX™ Glass, manufactured by Life Bioscience, Inc. (Albuquerque, N. Mex.), although other photoimageable glass manufacturers also can supply the requisite substrates. Photoimageable glasses are generally borosilicate-based glasses with oxide additions. In some implementations, a non-glass substrate can be used, such as a polycarbonate, acrylic, polyethylene terephthalate (PET) or polyether ether ketone (PEEK) substrate.

The signal transmission path 201 may be an integral conductive component, or may include any number of discrete, conductively coupled paths. In some implementations, for example, some portions of the signal transmission path 201 may be deposited on a surface of the substrate 220 using a physical vapor deposition (PVD) process, a chemical vapor deposition (CVD) process, an evaporation process, an electroplating process, an electrodeless plating process, or combination of such processes. Other portions, being disposed so as to pass through at least a portion of the substrate at an angle to the layout area 221 having a substantial component orthogonal to the layout area 221 may be configured as vias or through glass vias.

In the illustrated implementation, the signal transmission path 201 includes five segments: segments 211, 212, 213, 214 and 215. Segments 211, 213 and 215 of the illustrated implementation are shown to be disposed approximately parallel to the layout area 221. Segment 213 is shown to be disposed underneath the layout area 221 and at a substantial depth relative thereto. Segments 212 and 214 are shown to be disposed so as to pass through at least a portion of the substrate 220 at an angle to the layout area 221 that has a substantial component orthogonal to the layout area 221. In some implementations, the segments 212 and 214 pass through the entire depth of the substrate 220. Thus, in such implementations, the segments 211 and 215 are disposed on the top of the substrate 220, such as on the top surface of the substrate 220, and the segment 213 is disposed on the bottom of the substrate 220, such as on the bottom surface of the substrate 220.

Figure 3:
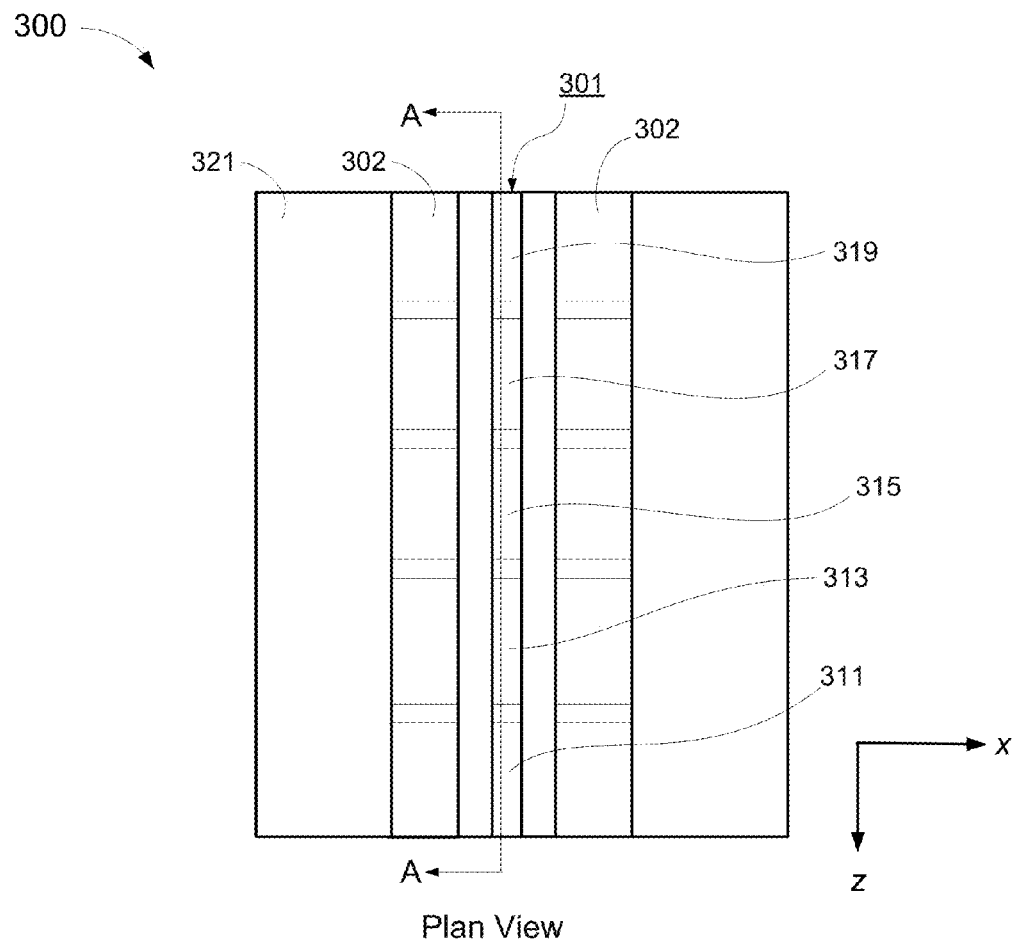
FIG. 3 illustrates an example implementation of a compact 3-D coplanar waveguide arrangement.
Figure 3:
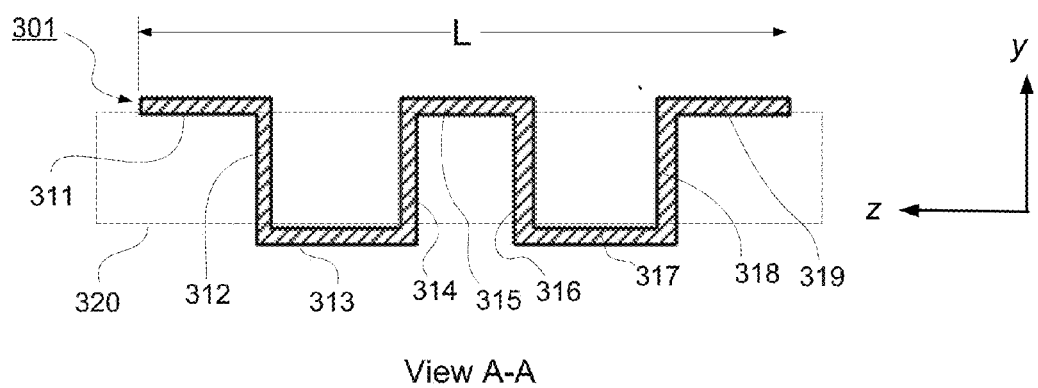

FIG. 3 illustrates an example implementation of a compact 3-D coplanar waveguide arrangement. An arrangement 300, as illustrated in the plan view, includes a CPW including a signal transmission path 301, and two ground strips 302 disposed within a substrate layout area 321 of a substrate 320. As illustrated in View A-A, the signal transmission path 301 includes nine segments: segments 311, 312, 313, 314, 315, 316, 317, 318 and 319. Each segment may have a respective length l(i). It will be appreciated that the pathlength of the signal transmission path 301 will be approximately l(311)+l(312)+l(313)+l(314)+l(315)+l(316)+l(317)+l(318)+l(319). Length L, however, will be substantially shorter than the pathlength. More particularly, in the illustrated implementation, L≈l(311)+l(313)+l(315)+l(317)+l(319). Where each segment has approximately equal length, L≈5×(l(311)+l(312)+l(313)+l(314)+l(315)+l(316)+l(317)+l(318)+l(319))/9.

Although in the illustrated implementation, each segment is approximately equal length, any combination of individual segment lengths are within the contemplation of this disclosure, provided only that a sum of the segment lengths is approximately equal to the desired path length. Moreover, although in the illustrated implementation nine segments are provided, a lesser or greater number of segments may be contemplated. For example, as few as three segments may be provided.

In the illustrated implementation the segments 311, 315 and 319 are shown to be disposed on a top surface of the substrate 320, whereas segments 313 and 317 are shown to be disposed on a bottom surface of the substrate 320. Thus, the segments 312, 314, 316 and 318 pass entirely through the substrate 320. The illustrated implementation may have certain benefits to manufacturability. For example, the illustrated implementation may be fabricated using planar 2D manufacturing processes. Planar manufacturing processes may include thin film deposition, photo resist processes, selective etching, and metallization, for example, which may be performed sequentially. Metal layer formation over a planar surface may be accomplished using various techniques. For example, a global metal layer deposition process, followed by selective etching may be performed. As a further example, an inter-layer dielectric material deposition process, followed by etching of selected areas, and then a metal layer deposition process in the selected areas may be performed. Where, as in the illustrated implementation, each of segments 311, 313, 315, 317 and 319 is a metal trace disposed on a glass surface, the segments may be formed using planar technology production steps, such as a combination of photo-resist, etching, plating, and sputtering processes. Other implementations, however, wherein one or more segments are substantially parallel to the layout area, but are disposed within the substrate, are also within the contemplation of this disclosure.

In some implementations, the segments 311, 315 and 319 may be formed as one or more conductive layers that are deposited on a surface of a substrate (not illustrated) using a physical vapor deposition (PVD) process, a chemical vapor deposition (CVD) process, an evaporation process, an electroplating process, an electrodeless plating process, or a combination of such processes. In some other implementations, the conductive layers may be deposited using a plating process. For example, a seed layer may first be deposited onto surfaces of a glass substrate. In some implementations, the seed layer may be deposited using a PVD process, a CVD process, an evaporation process, an atomic layer deposition (ALD) process, or an electrodeless plating process. In some implementations, the seed layer may include titanium (Ti), titanium nitride (TiN), ruthenium-titanium nitride (Ru—TiN), platinum (Pt), palladium (Pd), gold (Au), silver (Ag), copper (Cu), nickel (Ni), Mo, or tungsten (W). In some implementations, the seed layer may be about 25 nanometers (nm) to about 500 nm thick. After the seed layer is deposited, the metal layer may be deposited using a plating process, with the seed layer acting as a nucleation site for the plating process. The plating process may be an electrodeless plating process or an electroplating process. Cu, a Cu alloy, Ni, a Ni alloy, Au or aluminum (Al), for example, may be plated onto the seed layer. In some implementations, the plated metal may not be the same metal as a metal of the seed layer. In some other implementations, the plated metal may be the same metal as a metal of the seed layer. In some implementations, the thickness of the segments 311, 315 and 319 may be between about 0.5 microns and about 30 microns.

In some implementations, a dry film mask may be used to define the regions of the glass substrate onto which the metal layer is deposited. In some implementations, the dry film mask may be made of a photo-sensitive polymer. In some implementations, a photoresist may be used to define the portions of the seed layer onto which a metal will be plated. After plating the metal, the seed layer remaining on the surfaces of the glass substrate onto which the metal was not plated may be removed. For example, the seed layer may be removed with an etching process.

In some implementations, the segments 313 and 317 may be formed as one or more conductive layers disposed parallel to and underneath the layout area, at a substantial depth relative to the layout area.

In some implementations, the segments 312, 314, 316 and 318 may be formed as through-glass vias extending through the glass substrate. The through-glass vias may be produced by laser ablation process, a mediablasting or sandblasting process, an ultrasonic drilling process, an etching process, or a photoimageable glass processing process. A photoimageable glass processing process may include exposing areas defined by the mask to ultraviolet light, exposing the glass substrate to an elevated temperature, and removing the exposed portions of the glass substrate by subjecting such portions to a wet etch (such as HF acid, ethylenediamine pyrocatechol, potassium hydroxide/isopropyl alcohol, and/or tetra-methylammonium hydroxide). In some implementations, a deposited metal layer at least partially fills the vias and forms traces connecting the vias with adjacent segments. In some implementations, the segments 312, 314, 316 and 318 may have a diameter between about 20 microns and several hundred microns, and a depth extending about the thickness of the substrate.

Figure 4:
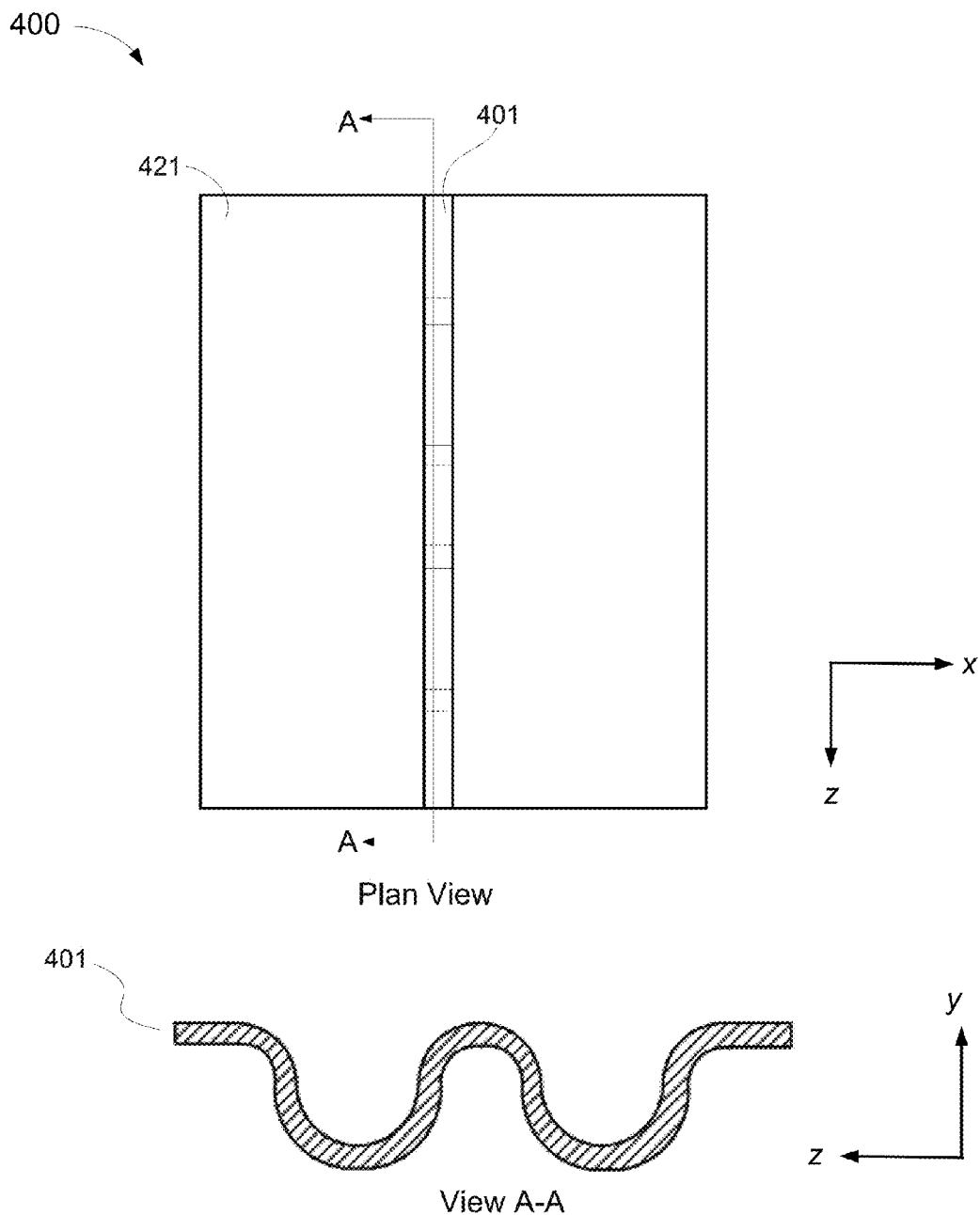
FIG. 4 illustrates a plan view and a side elevation view of an example implementation of a compact 3-D signal transmission path.

In the implementations illustrated hereinabove, the segments were shown as being straight and each segment was approximately orthogonal to an adjacent segment. A large number of other geometries are within the contemplation of this disclosure, a few of which will be described hereinbelow. For example, FIG. 4 illustrates a plan view and a side elevation view of an example implementation of a compact 3-D signal transmission path. In arrangement 400, a signal transmission path 401 may be part of a CTL, but for clarity of illustration, conductive paths that would ordinarily be coplanar with the signal transmission path 401 have been omitted. In the illustrated implementation, the signal transmission path 401 is disposed within the substrate layout area 421 and is configured such that the signal transmission path 401 follows a curvilinear wave pattern.

Figure 5:
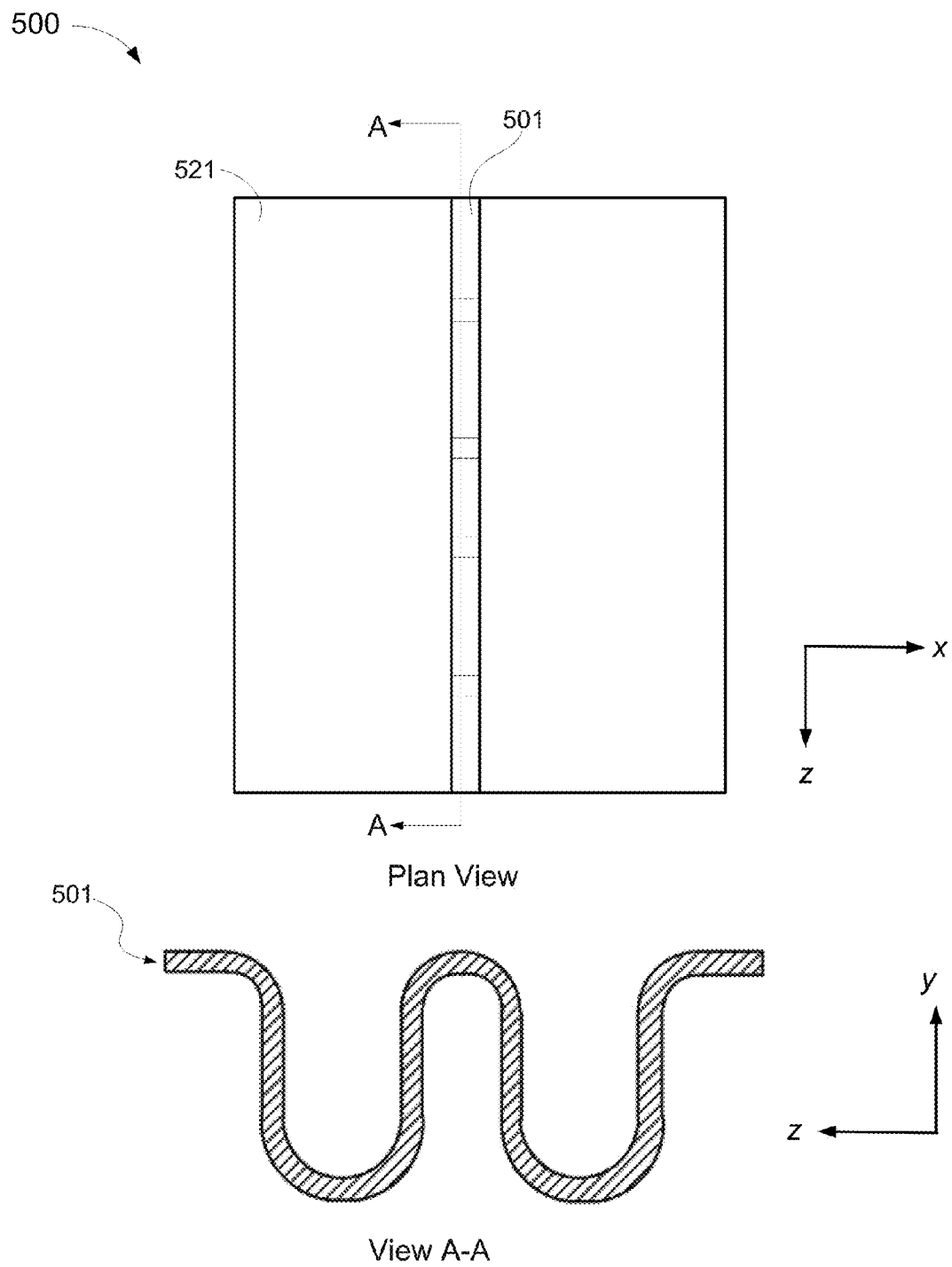
FIG. 5 illustrates a plan view and a side elevation view of an example implementation of a compact 3-D signal transmission path.

In the implementation illustrated in FIG. 4, an aspect ratio of path length substantially aligned in the y direction and path length substantially aligned in the z direction is approximately 1, but this is not necessarily the case. For example, FIG. 5 illustrates a plan view and a side elevation view of an example implementation of a compact 3-D signal transmission path. In arrangement 500, a signal transmission path 501 may be part of a CTL, but for clarity of illustration, conductive paths that would ordinarily be coplanar with the signal transmission path 501 have been omitted. In the illustrated implementation, the signal transmission path 501 is disposed within a substrate layout area 521 and is configured such that the signal transmission path 501 follows a curvilinear path. However, the aspect ratio of path length substantially aligned in the y direction to path length substantially aligned in the x direction is substantially greater than one.

Figure 6:
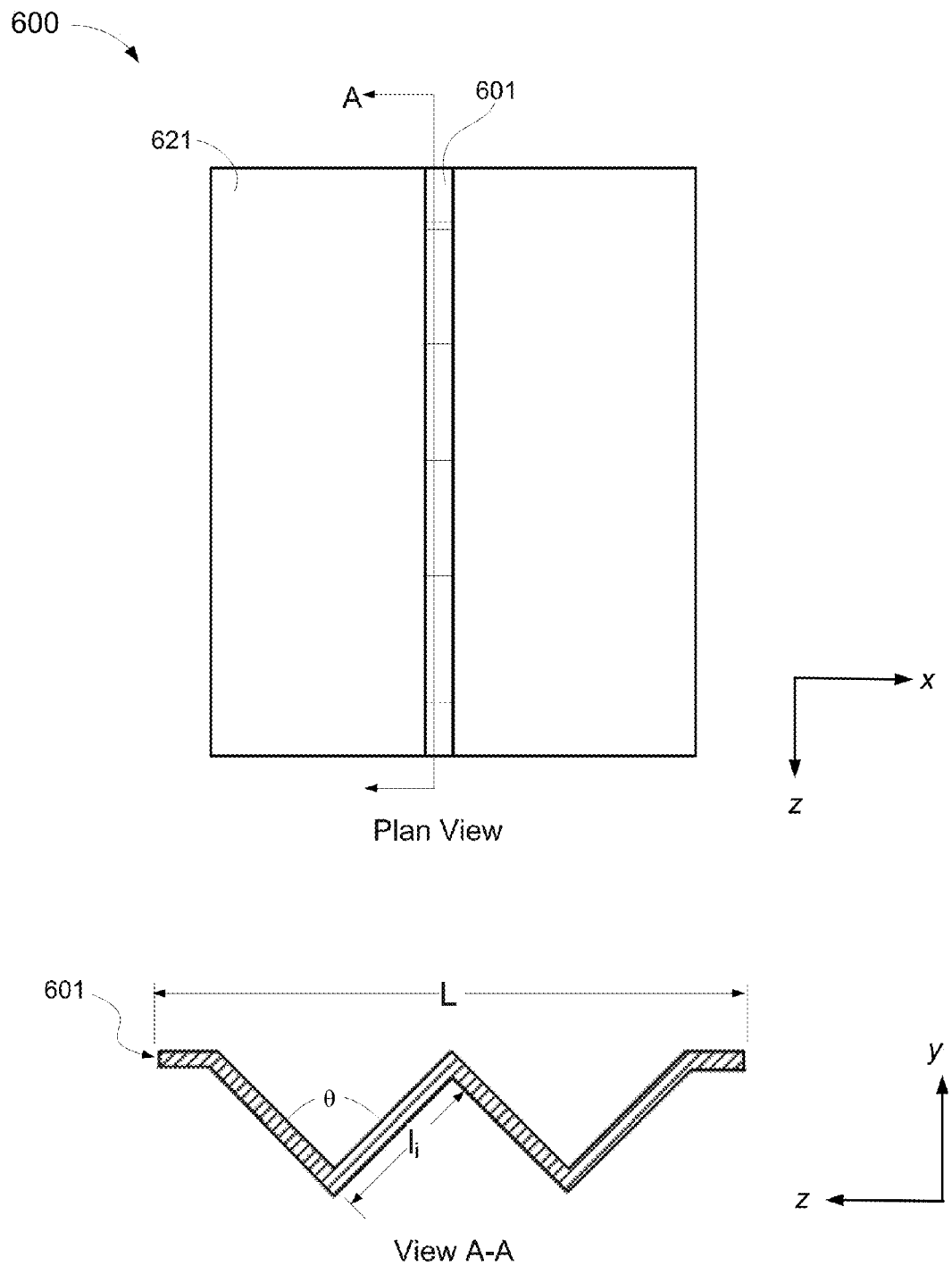
FIG. 6 illustrates a plan view and a side elevation view of an example implementation of a compact 3-D signal transmission path.

FIG. 6 illustrates a plan view and a side elevation view of an example implementation of a compact 3-D signal transmission path. In arrangement 600, a signal transmission path 601 may be part of a CTL, but for clarity of illustration, conductive paths that would ordinarily be coplanar with the signal transmission path 601 have been omitted. In the illustrated implementation, the signal transmission path 601 is disposed within a substrate layout area 621 and is configured such that the signal transmission path 601 follows a sawtooth pattern. Again, the disclosed techniques contemplate that the aspect ratio of path length substantially aligned in the y direction to path length substantially aligned in the x direction may be varied over a wide range. For example, by appropriate selection of angle θ and segment lengths l(i), the aspect ratio can be controlled over a wide range.

Figure 7:
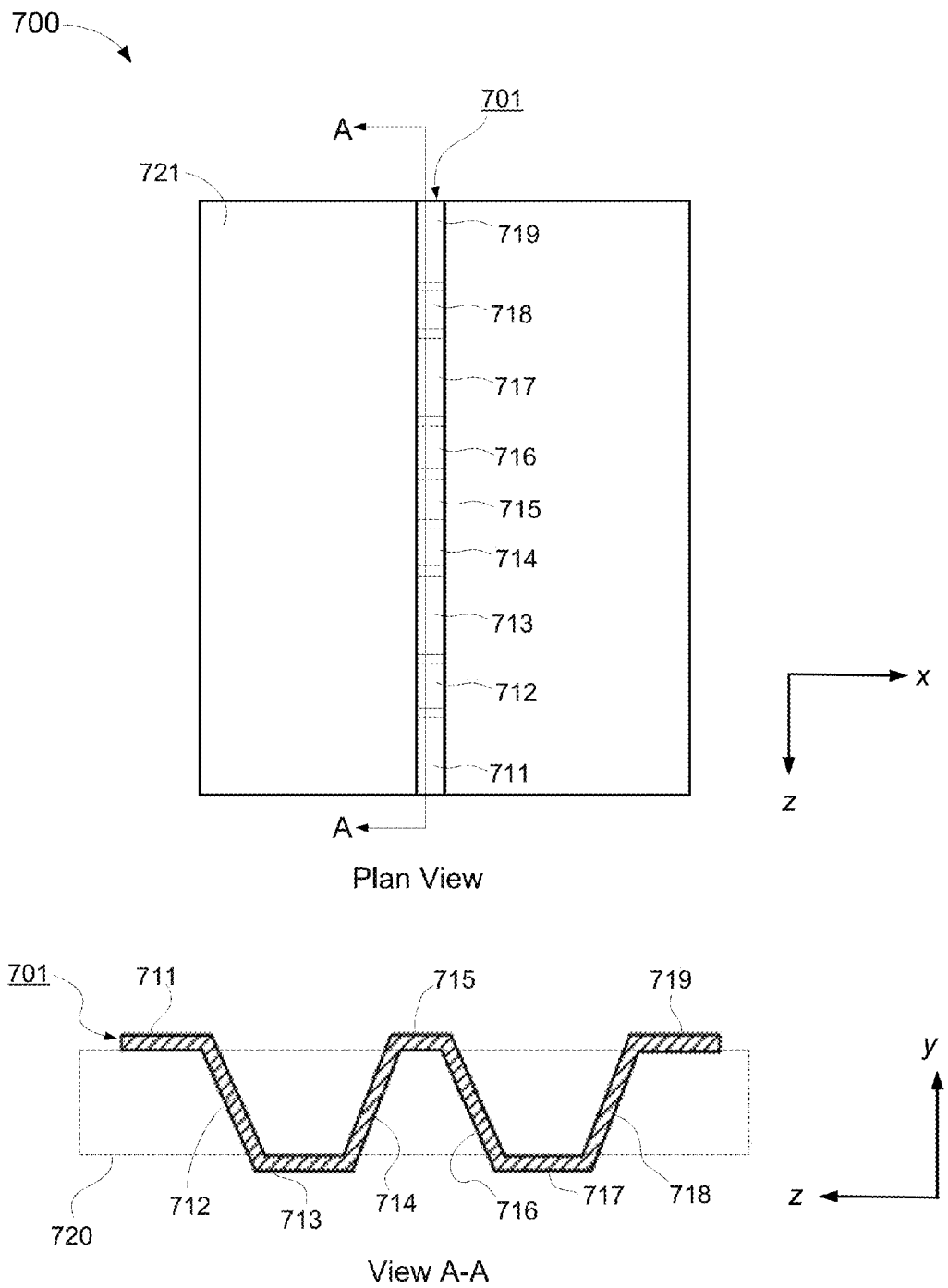
FIG. 7 illustrates a plan view and a side elevation view of a further example implementation of a compact 3-D signal transmission path.

FIG. 7 illustrates a plan view and a side elevation view of a further example implementation of a compact 3-D signal transmission path. In arrangement 700, a signal transmission path 701 may be part of a CTL, but for clarity of illustration, conductive paths that would ordinarily be coplanar with the signal transmission path 701 have been omitted. In the illustrated implementation, the signal transmission path 701 is disposed within a substrate layout area 721 and is configured such that the signal transmission path 701 includes segments 711, 713, 715, 717 and 719, disposed parallel to a substrate layout area 721, alternating with segments 712, 714, 716 and 718 that are each disposed so as to pass through the substrate at an angle to the layout area 721 having a substantial component orthogonal to the layout area 721.

In the illustrated implementation the segments 711, 715 and 719 are shown to be disposed on a top surface of the substrate 720, whereas segments 713 and 717 are shown to be disposed on a bottom surface of the substrate 720. Thus, the segments 712, 714, 716 and 718 pass entirely through the substrate 720. Other implementations, however, wherein one or more segments are substantially parallel to the layout area, but are disposed within the substrate, are also within the contemplation of this disclosure.

Figure 8:
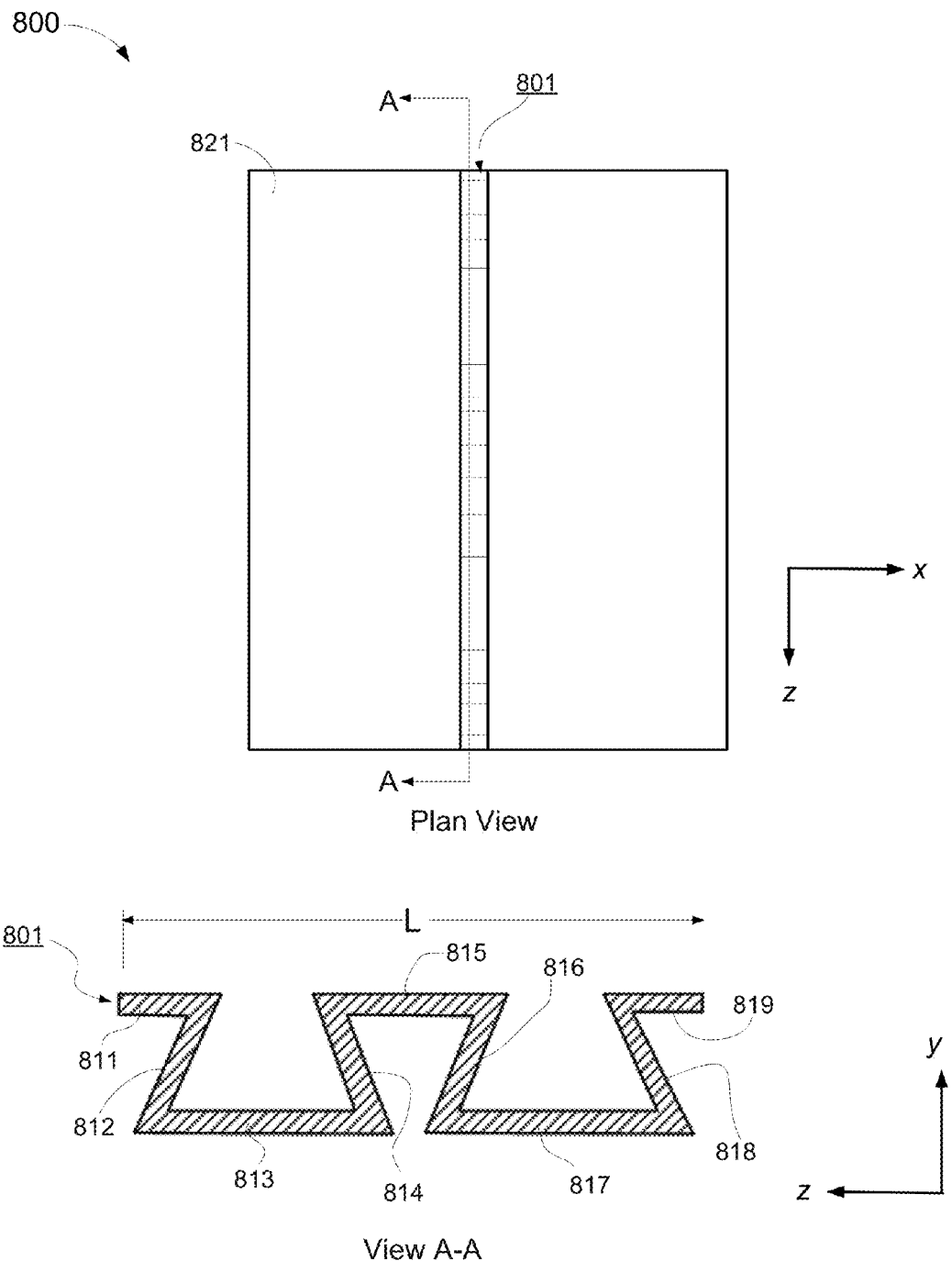
FIG. 8 illustrates a plan view and a side elevation view of a yet further example implementation of a compact 3-D signal transmission path.

FIG. 8 illustrates a plan view and a side elevation view of a yet further example implementation of a compact 3-D signal transmission path. In arrangement 800, a signal transmission path 801 may be part of a CTL, but for clarity of illustration, conductive paths that would ordinarily be coplanar with the signal transmission path 801 have been omitted. In the illustrated implementation, the signal transmission path 801 is disposed within a substrate layout area 821 and is configured such that the signal transmission path 801 includes segments 811, 813, 815, 817 and 819 disposed parallel to the substrate layout area 821 alternating with segments 812, 814, 816 and 818 that are each disposed so as to pass through the substrate at an angle to the layout area 821 having a substantial component orthogonal to the layout area 821. In the illustrated implementation, it should be noted that segments 812, 814, 816 and 818 are each disposed at an angle having a substantial retrograde component with respect to a signal path. More particularly, for an assumed signal direction in the +x direction (from a proximal segment 819 toward a distal segment 811), a signal traversing each of segments 812, 814, 816 and 818 will travel in a direction having a substantial component in the −z direction. Thus, a signal path length may be maximized for a given length L.

Figure 9:
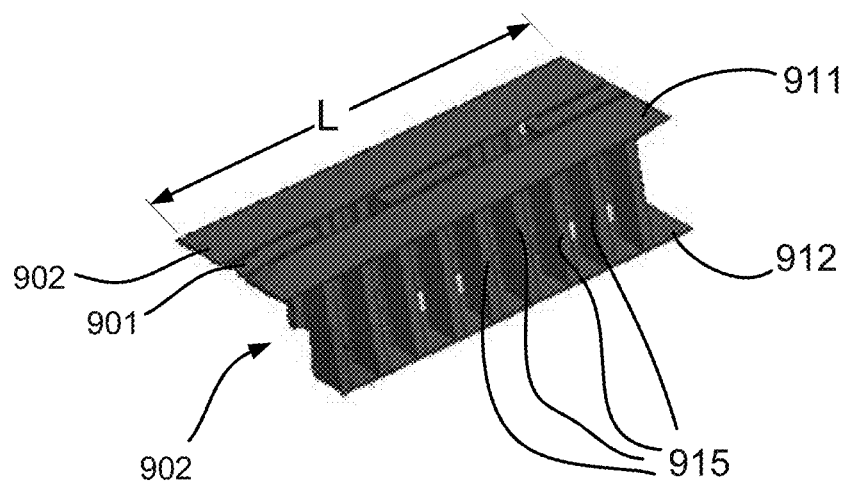
FIG. 9 illustrates an isometric projection of a further implementation of a compact 3-D CTL.

FIG. 9 illustrates an isometric projection of a further implementation of a compact 3-D CTL. In the illustrated implementation, a signal transmission path 901 is disposed in segments similarly to any of the above described implementations. One or both of ground lines G, on the other hand, may be configured in two parallel planes connected by metal shielding vias. In the illustrated implementation, for example, a first ground line 902, includes a first conductive planar strip 911 and a second, substantially parallel, conductive planar strip 912, connected by a number of conductive shielding vias 915. The conductive shielding vias 915 provide improved isolation for the signal transmission path 901.

In the illustrated implementation, the conductive shielding vias 915 may be uniformly distributed across length L without regard to how the signal transmission path 901 is configured. However, in some other implementations, one or more shielding vias 915 may be disposed proximate to segments of the signal transmission path 901 that have an angle to the plane of the layout area having a substantial component orthogonal to the plane of the first conductive planar strip 911.

In some implementations, one or more shielding vias 915 may be configured with an ovoid or elliptical cross section. In such implementations, a conductive shielding via 915 may be disposed such that a long axis of its cross section is parallel to length L, thereby increasing shielding effectiveness.

Figure 10A:
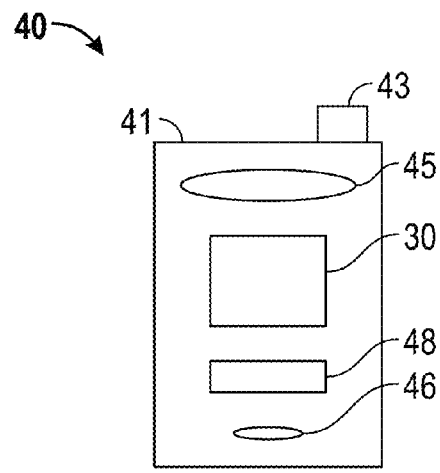
FIGS. 10A and 10B are system block diagrams illustrating a display device that includes a plurality of display elements.
Figure 10B:
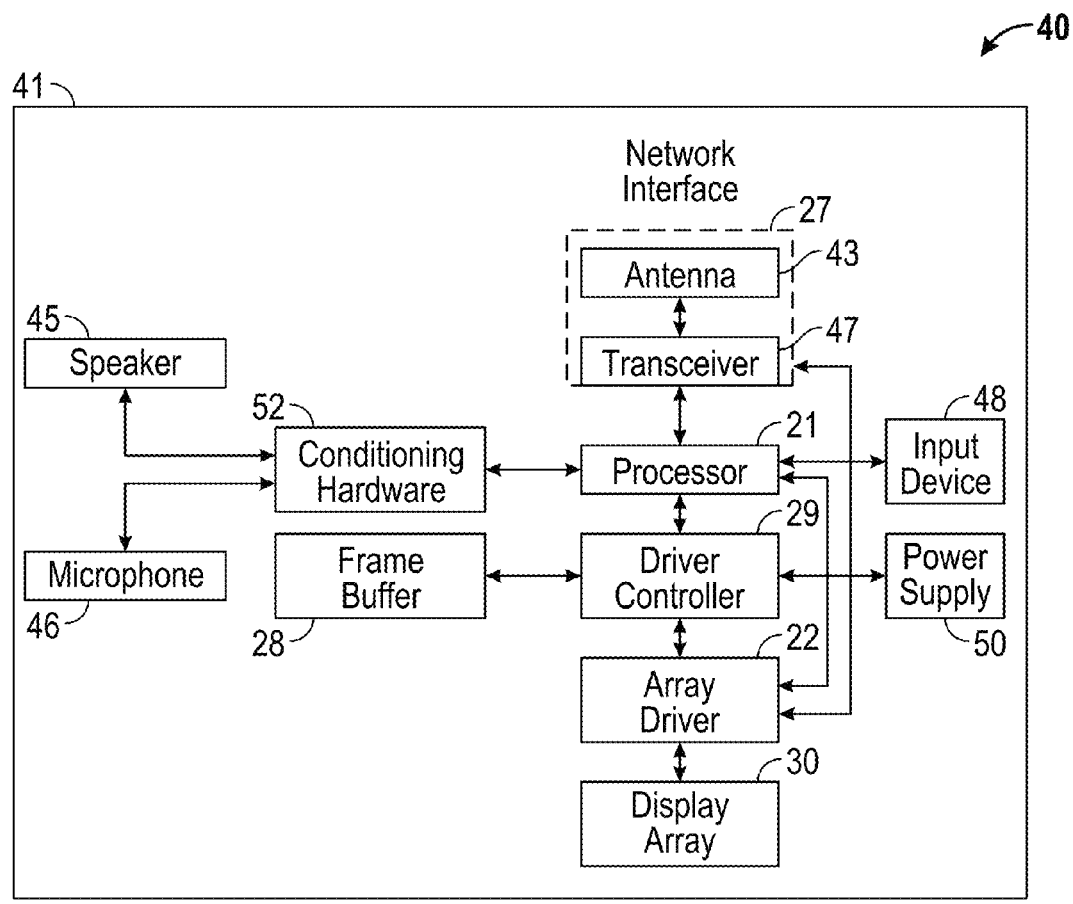

FIGS. 10A and 10B are system block diagrams illustrating a display device 40 that includes a plurality of display elements. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an interferometric modulator display.

The components of the display device 40 are schematically illustrated in FIG. 10A. The display device 40 includes a housing 41 and can include additional components at least partially enclosed therein. For example, the display device 40 includes a network interface 27 that includes an antenna 43 which can be coupled to a transceiver 47.

In some implementations, the antenna 43 may be coupled with the transceiver 47 by way of one or more CTLs. The CTL may be configured to handle a high-frequency signal for RF, micro-wave, or millimeter wave communications. Advantageously, the CPT may be configured to keep signal integrity by matching transmission path characteristic impedance.

In some implementations the CTL may be is used to couple a high-frequency signal between source and feed. Advantageously, CTL may be used, where the distance between source and feed is significant (for example, greater than 5% of wavelength). The CTL also may be used to manipulate an RF signal. For example, the CTL may be configured as a component of a power amplifier, a matching network, or a transmission line filter.

The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 10A, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can preprocess the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements.

In some implementations, the driver controller 29, the array driver 22, and the display array 30 are appropriate for any of the types of displays described herein. For example, the driver controller 29 can be a conventional display controller or a bi-stable display controller (such as a display element controller). Additionally, the array driver 22 can be a conventional driver or a bi-stable display driver (such as a display element driver). Moreover, the display array 30 can be a conventional display array or a bi-stable display array (such as a display including an array of display elements). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photo-voltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of, e.g., a CTL component as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An apparatus comprising:
a coplanar transmission line (CTL) having a plurality of communicatively coupled segments, the plurality of communicatively coupled segments including:
at least a first segment parallel to a layout area of a substrate,
at least a second segment disposed to pass through at least a portion of the substrate at an angle to the layout area having a substantial component orthogonal to the layout area,
at least a third segment parallel to and underneath the layout area, at a substantial depth relative to the layout area,
at least a fourth segment disposed to pass through at least a portion of the substrate at an angle to the layout area having a substantial component orthogonal to the layout area,
at least a fifth segment parallel to the substrate and within the layout area,
at least a sixth segment disposed to pass through at least a portion of the substrate at an angle to the layout area having a substantial component orthogonal to the layout area,
at least a seventh segment parallel to the substrate and within the layout area,
at least an eighth segment disposed to pass through at least a portion of the substrate at an angle to the layout area having a substantial component orthogonal to the layout area, and
at least a ninth segment parallel to the substrate and within the layout area.

2. The apparatus of claim 1, wherein:
the angle of the second segment is less than or equal to 90 degrees relative to the first segment,
the angle of the fourth segment is less than or equal to 90 degrees relative to the fifth segment,
the angle of the sixth segment is less than or equal to 90 degrees relative to the seventh segment, and
the angle of the eighth segment is less than or equal to 90 degrees relative to the fifth segment.

3. The apparatus of claim 2, wherein the fifth segment is substantially co-planar with the first segment.

4. The apparatus of claim 1, wherein at least one of the second segment and fourth segment is orthogonal to the first segment.

5. The apparatus of claim 1, wherein at least one of the second segment and fourth segment is approximately equal in length to the first segment.

6. The apparatus of claim 1, wherein each of the first segment, the second segment, the third segment, the fourth segment, and the fifth segment is approximately equal in length.

7. The apparatus of claim 1, wherein the second segment includes at least one conductive strip configured as a via.

8. The apparatus of claim 1, wherein the substrate is glass.

9. A coplanar transmission line (CTL) comprising:
a proximal end and a distal end separated, in a first plane, by a distance 'D', the first plane being parallel to a layout area of a substrate, and being defined by an axis 'x' and an axis 'z' orthogonal thereto, the CTL configured to provide a signal transmission path having pathlength 'L',
the CTL having a plurality of communicatively coupled segments, the plurality of communicatively coupled segments including:
at least a first segment parallel to a layout area of a substrate,
at least a second segment disposed to pass through at least a portion of the substrate at an angle to the layout area having a substantial component orthogonal to the layout area, and
at least a third segment parallel to and underneath the layout area, at a substantial depth relative to the layout area,
at least a fourth segment disposed to pass through at least a portion of the substrate at an angle to the layout area having a substantial component orthogonal to the layout area,
at least a fifth segment parallel to the substrate and within the layout area,
at least a sixth segment disposed to pass through at least a portion of the substrate at an angle to the layout area having a substantial component orthogonal to the layout area,
at least a seventh segment parallel to the substrate and within the layout area,
at least an eighth segment disposed to pass through at least a portion of the substrate at an angle to the layout area having a substantial component orthogonal to the layout area, and
at least a ninth segment parallel to the substrate and within the layout area and wherein:
D is substantially aligned along axis z;
L is at least 1.5×D;
the CTL is configured such that at least one third of the pathlength L is disposed along one or more directions having a substantial component orthogonal to the first plane; and
less than one third of the pathlength L is disposed in a direction having a substantial component parallel to axis x.

10. The CTL of claim 9, wherein the CTL is disposed such that the signal transmission path substantially follows a square wave pattern.

11. The CTL of claim 9, wherein the CTL is disposed such that the signal transmission path substantially follows a curvilinear wave pattern.

12. The CTL of claim 9, wherein the CTL is disposed such that the conductive path follows a sawtooth pattern.

13. The CTL of claim 9, wherein the CTL wherein the third segment extends under the first segment and the fifth segment, the seventh segment extends under the fifth segment and the ninth segment.

14. The CTL of claim 13, wherein:
the angle of the second segment is less than or equal to 90 degrees relative to the first segment,
the angle of the fourth segment is less than or equal to 90 degrees relative to the fifth segment,
the angle of the sixth segment is less than or equal to 90 degrees relative to the seventh segment, and
the angle of the eighth segment is less than or equal to 90 degrees relative to the fifth segment.

15. The CTL of claim 14, wherein the fifth segment is substantially co-planar with the first segment.

16. The CTL of claim 13, wherein the second segment includes at least one conductive strip configured as a via.

17. The CTL of claim 9, wherein the substrate is glass.

18. An apparatus comprising:
a signal transmission path having a plurality of communicatively coupled segments, the plurality of communicatively coupled segments including:
at least a first segment parallel to a layout area of a substrate,
at least a second segment disposed at an angle to the layout area having a substantial component orthogonal to the layout area,
at least a third segment parallel to and underneath the layout area, at a substantial depth relative to the layout area,
at least a fourth segment disposed to pass through at least a portion of the substrate at an angle to the layout area having a substantial component orthogonal to the layout area,
at least a fifth segment parallel to the substrate and within the layout area,
at least a sixth segment disposed to pass through at least a portion of the substrate at an angle to the layout area having a substantial component orthogonal to the layout area,
at least a seventh segment parallel to the substrate and within the layout area,
at least an eighth segment disposed to pass through at least a portion of the substrate at an angle to the layout area having a substantial component orthogonal to the layout area, and
at least a ninth segment parallel to the substrate and within the layout area,
wherein the signal transmission path is disposed between two conductive ground lines, at least one of the conductive ground lines including a first conductive planar strip and a second, substantially parallel, conductive planar strip, the first and second conductive planar strips connected by a plurality of metal shielding vias and the first conductive strip substantially coplanar with the first segment.

19. The apparatus of claim 18, wherein:
the angle of the second segment is less than or equal to 90 degrees relative to the first segment,
the angle of the fourth segment is less than or equal to 90 degrees relative to the fifth segment,
the angle of the sixth segment is less than or equal to 90 degrees relative to the seventh segment, and
the angle of the eighth segment is less than or equal to 90 degrees relative to the fifth segment.

20. The apparatus of claim 18, wherein the second segment includes at least one conductive strip configured as a via.

* * * * *